United States Patent
Othieno et al.

(10) Patent No.: US 7,235,889 B2
(45) Date of Patent: Jun. 26, 2007

(54) INTEGRATED HEATSPREADER FOR USE IN WIRE BONDED BALL GRID ARRAY SEMICONDUCTOR PACKAGES

(75) Inventors: Maurice O. Othieno, Union City, CA (US); Hong T. Lim, San Jose, CA (US); Qwai H. Low, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 427 days.

(21) Appl. No.: 10/939,082

(22) Filed: Sep. 10, 2004

(65) Prior Publication Data

US 2006/0055029 A1    Mar. 16, 2006

(51) Int. Cl.
H01L 23/28 (2006.01)
H01L 23/10 (2006.01)

(52) U.S. Cl. ............... 257/796; 257/706; 257/707; 257/712; 257/713; 257/722; 257/E23.103; 257/E23.105

(58) Field of Classification Search ............ None
See application file for complete search history.

(56) References Cited

U.S. PATENT DOCUMENTS 4,327,399 A * 4/1982 Sasaki et al. ............ 361/698
6,114,761 A * 9/2000 Mertol et al. ............ 257/722
6,751,099 B2 * 6/2004 Vrtis et al. ............... 361/705
7,005,737 B2 * 2/2006 Zhao et al. ............... 257/707

* cited by examiner

Primary Examiner—Jasmine Clark
(74) Attorney, Agent, or Firm—Beyer Weaver LLC

(57) ABSTRACT

The present invention is directed toward systems, packages, and methods for providing improved thermal performance in such packages and systems. Embodiments of the invention include a semiconductor integrated circuit (IC) package having a substrate with a heat spreader mounted on the substrate. An IC die is mounted to the heat spreader such that the heat spreader lies in between the die and the substrate. The invention is also directed to a heat spreader plate useable in a semiconductor package. The heat spreader plate comprises a plate comprised of thermally conductive material suitable for attachment to a packaging substrate wherein the plate includes openings for exposing electrical bonding surfaces of a packaging substrate when the heater spreader plate is mounted on the packaging substrate. Such openings enable wirebonding between the exposed electrical bonding surfaces of the substrate and an integrated circuit die to complete construction of a package including the heatspreader.

11 Claims, 3 Drawing Sheets

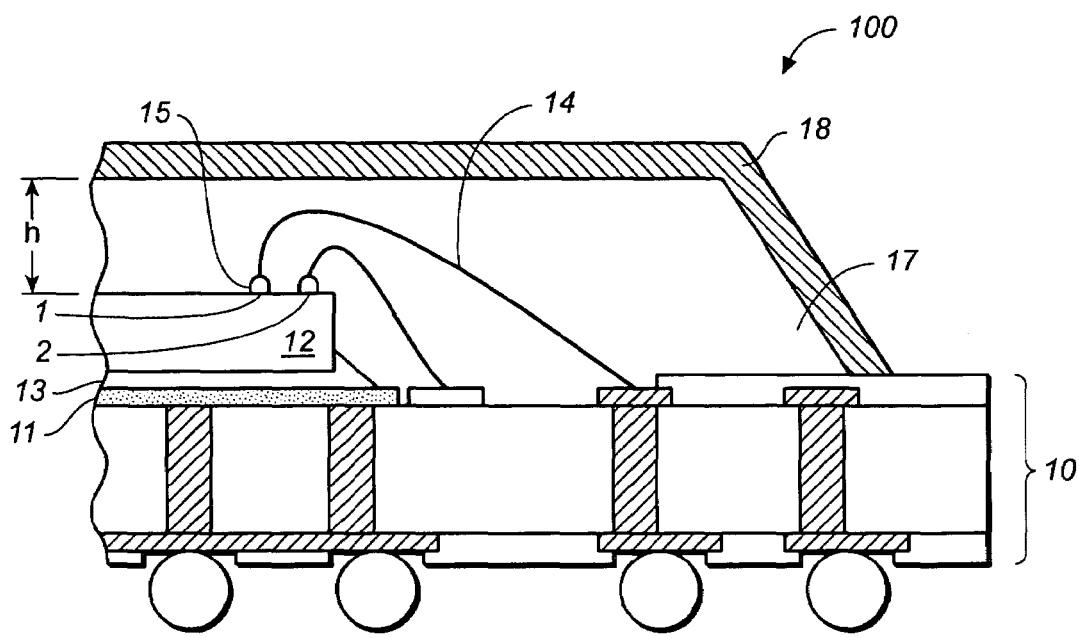
FIG._1(PRIOR ART)
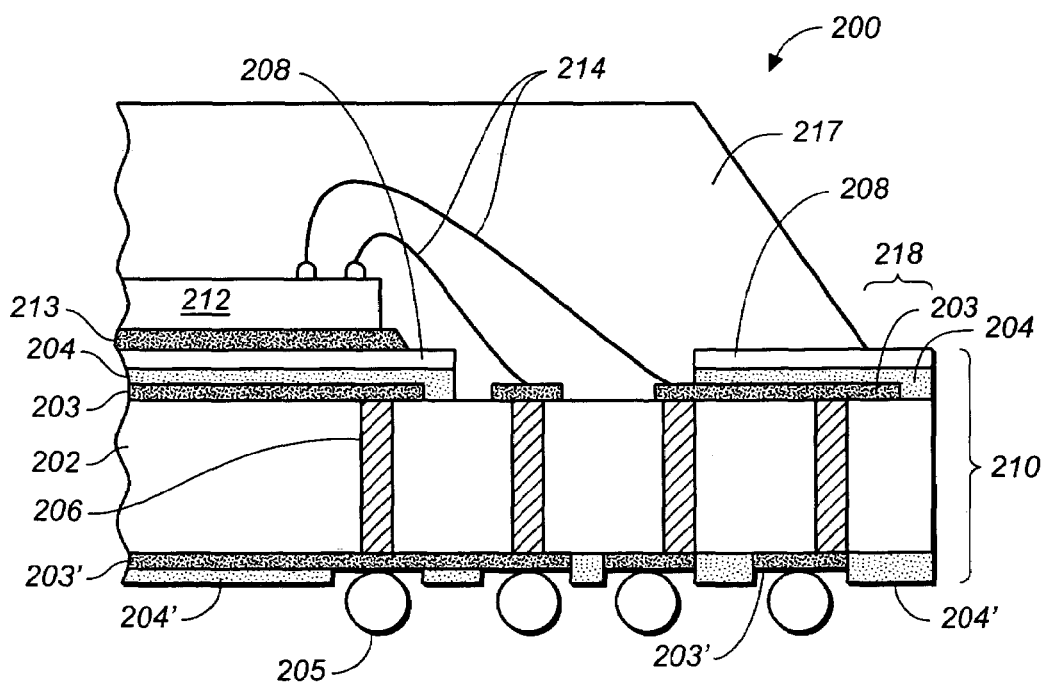
FIG._2A

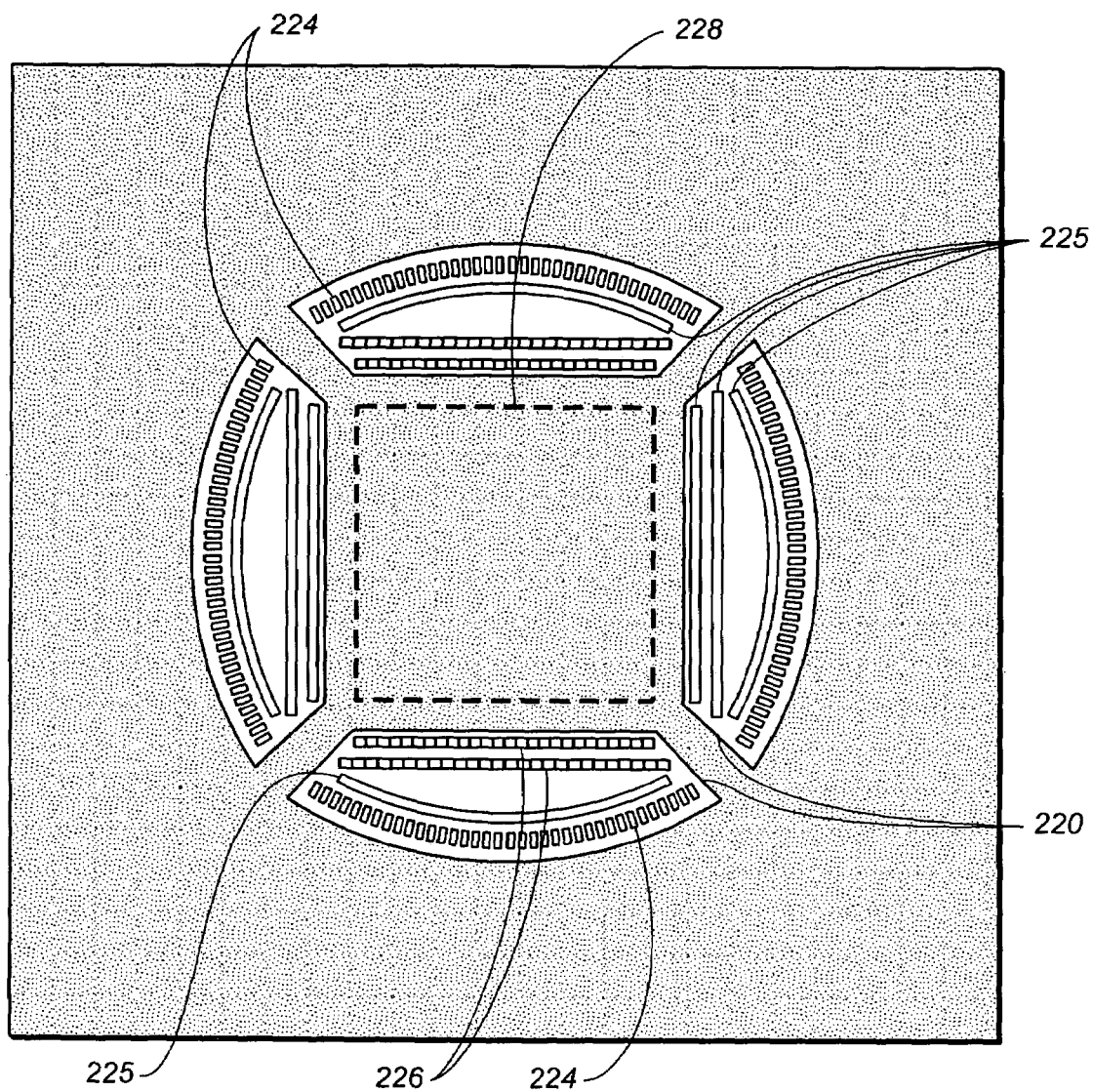
FIG._2B

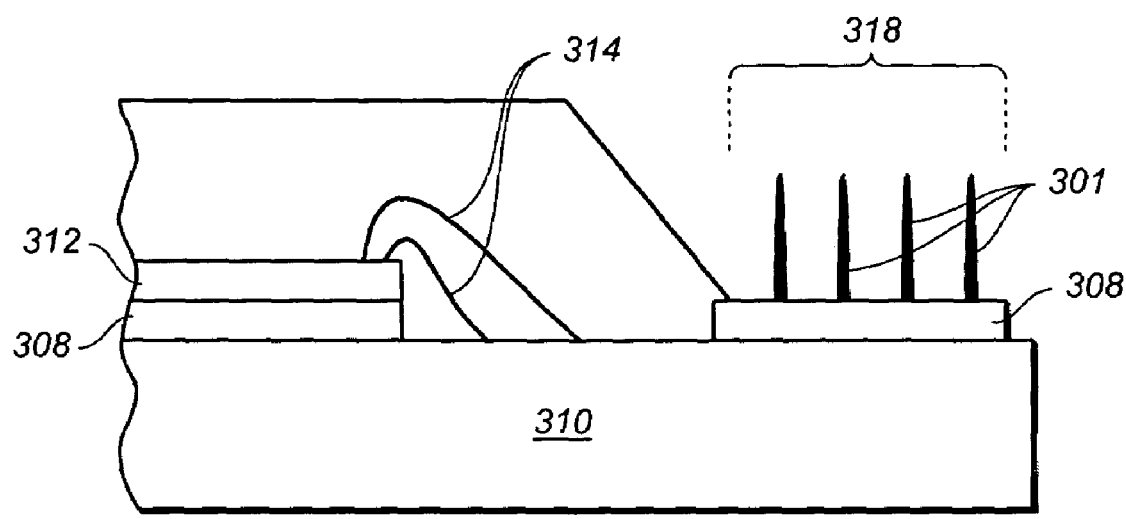
FIG._3A
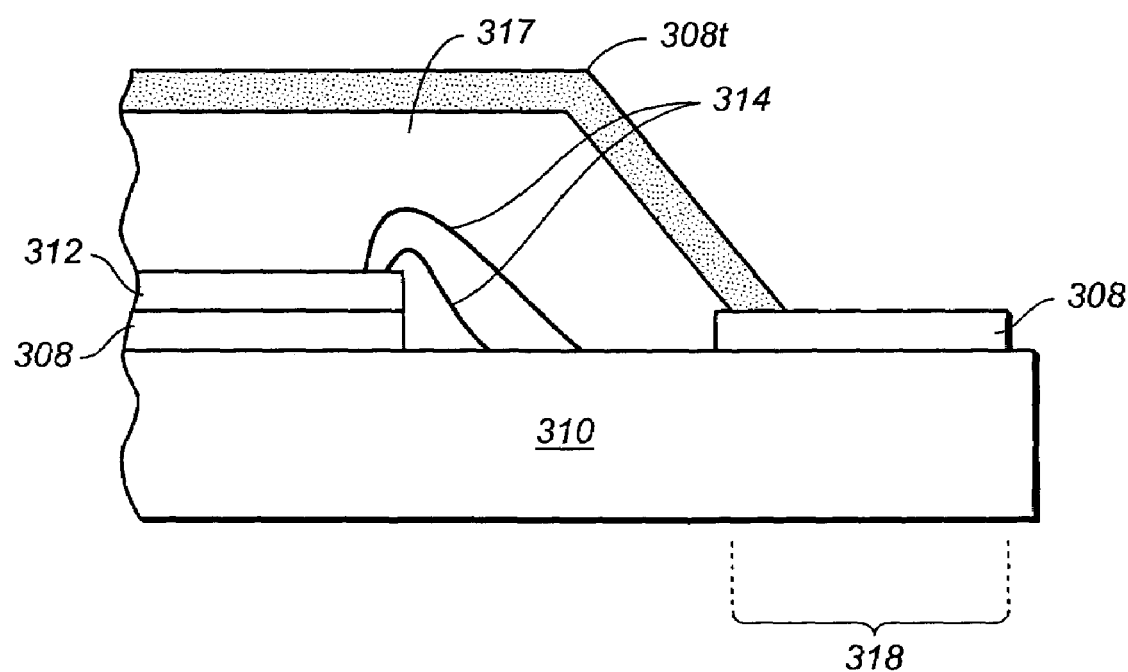
FIG._3B

INTEGRATED HEATSPREADER FOR USE IN WIRE BONDED BALL GRID ARRAY SEMICONDUCTOR PACKAGES

TECHNICAL FIELD

The invention described herein relates generally to semiconductor device packaging. In particular, the invention relates to a semiconductor device package that constructed such that a heat spreader is advantageously positioned between the chip substrate and the semiconductor die thereby increasing the thermal cooling properties of the package.

BACKGROUND

Heat spreaders are generally used in integrated circuit device packages. One such integrated circuit device package 100 is shown in the simplified schematic illustration of FIG. 1. The depicted package 100 is a ball grid array type package. In FIG. 1, there is a substrate 10 onto which an integrated circuit device (also referred to herein as an IC die or chip) 12 is mounted. The die 12 is commonly attached to a front side surface of the substrate 10. Commonly this means attachment to a front side die attach pad 11 with an epoxy material 13. The depicted substrate 10 includes copper conducting structures 11 (for example, bonding pads, bonding rings, bond fingers, and the like) that comprise electrical connections in the package 100. These wires 14 are connected to rows of bond pads on the die by ball bonds 15. Thus, the electrical connections of the die 12 are electrically connected to selected conducting structures 11 using the bonding wires 14. The die 12 is encapsulated with a molding material 17. Additionally, a heat spreader 18 is adhered (commonly using epoxy) to the front side surface of the substrate 10 to protect the die 12 and to spread the heat generated by the die 12 over a larger area. Importantly, in conventional packages the heat spreader 18 is attached to the top of the package. Thus, heat generated by the die 12 passes through the encapsulating layer 17 to thermally communicate with the heat spreader 18.

In many conventional applications such an arrangement has proved satisfactory. However, with the increasing circuit density within dies 12 arises a need for more connections from the die 12 to the substrate 10. The depicted configuration uses two rows 1,2 of die mounted bond pads to connect with the various conducting structures 11 of the substrate 12. It is becoming common to use three row implementations and newer packages will use four or more rows. With each added row comes the necessity to increase the height h of the layer of encapsulating molding material 17 to sufficiently protect the wires 14. As this height h increases the heat dissipation effectiveness of the heatspreader 18 decreases due to increasing distance away from the die. Additionally, as the processing power of modern semiconductor devices increases, such devices can perform more operations per second. With this increasing speed comes increasing heat. Thus, among other things, there is a need for systems and methods that can improve the thermal performance of the package. semiconductor package and methods for its fabrication are disclosed.

In general, the present invention is directed toward systems, packages, and methods for providing improved cooling in such packages and systems.

One embodiment of the invention comprises a semiconductor integrated circuit (IC) package. The package includes a packaging substrate with a heat spreader mounted on a first side of the substrate. An integrated circuit die is mounted to the heat spreader such that the die is in thermal communication with the heat spreader and such that the heat spreader lies in between the die and the substrate.

In another embodiment, a heat spreader plate for use in a semiconductor package is disclosed. The heat spreader plate comprises a plate comprised of thermally conductive material suitable for attachment to a packaging substrate. The plate includes openings configured to expose electrical bonding surfaces of a packaging substrate when the heat spreader plate is mounted on the packaging substrate. Such openings enable wirebonding between the exposed electrical bonding surfaces of the substrate and a integrated circuit die.

Other aspects and advantages of the invention will become apparent from the following detailed description and accompanying drawings which illustrate, by way of example, aspects of the invention.

BRIEF DESCRIPTION OF THE DRAWINGS

The following detailed description will be more readily understood in conjunction with the accompanying drawings, in which:

FIG. 1 is a simplified schematic cross section view of a portion of a conventional integrated circuit package used to package semiconductor IC chips.

FIG. 2A is simplified cross-sectional view of a semiconductor package embodiment having a heat spreader interposed between a packaging substrate and a semiconductor die in accordance with an embodiment of the invention.

FIG. 2B is simplified plan view of a heat spreader plate embodiment placed on a packaging substrate in accordance with the principles of the invention.

FIGS. 3A and 3B are simplified cross-sectional views of additional semiconductor package embodiments constructed in accordance with the principles of the invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, semiconductor device package embodiments will be disclosed. In particular, the depicted structures depict package embodiments having heat spreaders attached to the package between the substrate and the die. Such packages provide improved heat dissipation performance relative to conventional packages. Additionally, embodiments of the invention include packages configured such that the heat spreader includes cooling fins to increase thermal performance. And also includes embodiments that have portions of the heatspreader extending to the edge of the package thereby having an edge portion capable of radiating heat thereby dissipating heat from the package. Such package configurations demonstrate superior thermal properties relative to conventional packages.

FIG. 2A depicts one embodiment of a semiconductor package 200 constructed in accordance with the principles of the invention. The depicted embodiment is a simplified cross-section view of a package embodiments constructed in accordance with the principles of the invention. The depicted embodiment includes a substrate 210 constructed in accordance with the principles of the invention. In the depicted embodiment, the substrate 210 comprises a standard PBGA (plastic ball grid array) substrate. Typically, such substrates 210 include a core 202 sandwiched between two or more metallization layers. For example, metallization layers 203, 203' which also typically include layers of solder mask 204, 204'. Commonly, the core 202 is formed of fiber material suspended in a cured BT (bismaleimide triazine) resin material. This core 202 is then treated to form metallization layers 203, 203'. Commonly, copper materials or coated copper materials are used. However, other conductive materials can be used. Solder mask layers 204, 204' can then be formed over portions of the metallization layers 203, 203'. Such substrates 210 are commonly very thin, on the order of about 0.50–0.60 mm thick. Additionally, the metallization layers 203, 203' can be used to define electrical bonding surfaces including bonding rings, bonding pads, bond fingers (as well as many other different types of electrical connections used in semiconductor packaging). Additionally, solder balls 205 are attached to a backside surface of the substrate 201 to facilitate the physical and electrical connection of the package 200 to a system board (e.g., a motherboard). Methods used for constructing such substrates 210 are known to those having ordinary skill in the art.

Insulating layers 204, 204' can be formed over portions of the metallization layers 203, 203' to provide electrical insulation between various portions of metallization layers 203, 203' and also to provide electrical insulation from other layers formed over top of the metallization layers 203, 203'. One commonly used material for forming insulating layers 204, 204' is solder mask material. It is to be noted that the front side metallization layers 203 can be electrically connected with backside metallization layers 203 using via structures 206.

In accordance with an embodiment of the invention, a thermally conductive heat spreader plate 208 is then attached to the substrate 210. This heat spreader plate 208 is attached to a front side surface of the substrate 210. Typically such attachment is accomplished using any one of a number of suitable adhesives. In one example, epoxy materials can be used. In one embodiment, the heat spreader plate 208 is formed of copper or other thermally conductive material. Embodiments of a heat spreader 208 can be layered. For example, a copper heat spreader 208 having a nickel layer plated on a top surface can be employed. Also, embodiments of the heat spreader 208 can be of many thicknesses. For example, thicknesses in the range of about 6–25 mil are typically suitable. In one implementation a heat spreader 208 of about 12 mils thickness is employed.

An integrated circuit (IC) die 212 is attached to a front side surface of the heat spreader plate 208. Commonly, such attachment is accomplished using an adhesive (e.g., epoxy) 213. Thermally, conductive adhesives are particularly suitable (although not required) for die attachment. Thus, a very thin adhesive layer is now all that lies between the die 212 and heat spreader 208. This configuration significantly improves the thermal performance of the package relative to conventional configurations. As with conventional embodiments, the die 212 is electrically connected to selected electrical bonding surfaces formed by the metallization layers 203, 203'. Such electrical connections are typically established using bonding wires 214 (which can also connect to underlying metallization layers 203' using conducting vias 206 that penetrate through the substrate 210). The die 212 and bonding wires 214 are encapsulated using a mold cap 217 made of molding material that protects and seals the inner components of the package 200. Such molding materials are commercially available and well known in the art.

It should be noted that in the depicted embodiment the heat spreader 208 extends past the edge of the mold cap 217 to form an exposed rim portion 218. This edge portion 218 can improve thermal performance by radiating heat into the ambient environment. However, the inventors point out that edge of the mold cap 217 can extend all the way to the end of the substrate 210. Such embodiments still fall within the intended scope of the invention although there is no exposed rim portion of the embodiments where the heat spreader 208.

FIG. 2B is a plan view showing an embodiment of heat spreader 208 which can be mounted onto a substrate in accordance with the principles of the invention. The heat spreader 208 includes a plurality of cutouts 220 that are openings in the heat spreader. The depicted heat spreader 208 is shown mounted on a substrate having a plurality of electrical bonding surfaces exposed. Such electrical bonding surfaces include bonding fingers 224, bonding rings 225, bonding pads 226, and other related electrical contact structures. These electrical bonding surfaces are situated in the cutouts 220 to facilitate wire bonding with a die. The dashed lines 228 correspond to a bonding locality for attaching a die onto the heat spreader 208.

Another embodiment is depicted in the simplified cross-section view of FIG. 3A which show a substrate 310 embodiment upon which an integrated circuit die 312 is mounted. In the depicted embodiment, the substrate 310 comprises, for example, a standard two level PBGA (plastic ball grid array) substrate. As explained previously, such substrates 310 typically include metallization layers, vias, and backside solder balls. The die 312 is wire bonded 314 to electrical bonding surfaces of the substrate 310. In the depicted embodiment, cooling fins 301 are added to the exposed rim portion 318 of the heat spreader 308. Such cooling fins 301 are generally thin strips of thermally conductive material in thermal communication with the heat spreader 308. Such fins 301 can enhance the cooling properties of the heat spreader 308. The inventors also contemplate embodiments where the fins are encapsulated by the mold cap.

Another embodiment is depicted in the simplified cross-section view of FIG. 3B which show a substrate 310 embodiment upon which an integrated circuit die 312 is mounted. In the depicted embodiment, the substrate 310 comprises, for example, a standard two level PBGA (plastic ball grid array) substrate. As explained previously, such substrates 310 typically include metallization layers, vias, and backside solder balls. The die 312 is wire bonded 314 to electrical bonding surfaces of the substrate 310. As with other embodiments, a heat spreader 308 is mounted between the die 312 and the substrate 310. Additionally, in the depicted embodiment, a second (or top) heat spreader 308t can be added over the mold cap 317. Additionally, the second heat spreader 308t can be in thermal contact with the exposed rim portion of the heat spreader 308 located at the outer portion 318 of the substrate. Typically, this is accomplished by positioning the second heat spreader 308t in physical contact with the heat spreader 308. For example, solder can be used to adhere the second heat spreader 308t to the heat spreader 308 In other embodiments, the second heat spreader 308*t* is not in thermal communication with or physical contact with the heat spreader 308.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that cooling fins can be attached to the portions of the heat spreader internal to the mold cap to enhance the thermal properties of the package. Although only a few configurations are expressly disclosed herein, it should be appreciated by anyone having ordinary skill in the art that, using the teachings disclosed herein, many different package support configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor integrated circuit (IC) package comprising:
   a packaging substrate suitable for mounting thereto an integrated circuit die wherein the substrate includes a die bonding pad and electrical bonding surfaces on first side of the substrate and solder balls on a second side of the substrate, said solder balls being electrically connected with at least some of the electrical bonding surfaces by electrically conductive vias that pass through the substrate;
   a heat spreader mounted on a first side of the substrate and configured to include a set of cutout openings to expose the electrical bonding surfaces so that they can be wire bonded to the die;
   an integrated circuit die mounted to the heat spreader such that the die is in thermal communication with the heat spreader and such that the heat spreader lies in between the die and the substrate thereby enabling a portion of the heat generated by the die to be dissipated from the die through the heat spreader and wherein the die is electrically connected to some of the solder balls using wire bonds to electrically connect with the electrical bonding surfaces;
   a protective mold cap for encapsulating the die, wire bonds, and at least a portion of the heat spreader; and
   wherein a portion of the heat spreader extends beyond the mold cap towards an edge portion of the substrate to expose an outer rim of the heat spreader.

2. The package of claim 1 wherein the portion of the heat spreader that extends beyond the mold cap includes cooling fins.

3. The package of claim 2 wherein a portion of the heat spreader that is internal to the mold cap includes cooling fins.

4. The package of claim 1 wherein a portion of the heat spreader that is internal to the mold cap includes cooling fins.

5. The package of claim 1 wherein the package comprises a ball grid array package.

6. An electronic device incorporating the IC package of claim 1.

7. An electronic device incorporating the IC package of claim 1 wherein the electronic device comprises a computer device.

8. The package of claim 1 wherein the portion of the heat spreader that extends beyond the mold cap exposes flat upper surface of the heat spreader to the ambient to enable cooling.

9. The package of claim 1 wherein the heat spreader mounted on the first side of the substrate comprises a first heat spreader; and
   wherein the protective mold cap extends above the die to provide clearance for the wire bonds that extend from the top of the die;
   the package further including a second heat spreader mounted on the mold cap such that it is not in contact with the die thereby enabling the wire bonds to be formed on top of the die.

10. The package of claim 9 wherein the first heat spreader is in thermal communication with the second heat spreader.

11. The package of claim 9 wherein the first heat spreader is in physical contact with the second heat spreader.

* * * * *